(12) United States Patent
Krause et al.

(10) Patent No.: US 8,192,132 B2
(45) Date of Patent: Jun. 5, 2012

(54) TRANSFER CHAMBER FOR A VACUUM PROCESSING APPARATUS, AND A VACUUM PROCESSING APPARATUS

(75) Inventors: Jochen Krause, Dresden (DE); Michael Hofmann, Dresden (DE)

(73) Assignee: VON ARDENNE Anlagentechnik GmbH, Dresden (DE)

( * ) Notice: Subject to any disclaimer, the term of this patent is extended or adjusted under 35 U.S.C. 154(b) by 478 days.

(21) Appl. No.: 12/324,244

(22) Filed: Nov. 26, 2008

(65) Prior Publication Data

US 2009/0142165 A1    Jun. 4, 2009

(30) Foreign Application Priority Data

Nov. 30, 2007  (DE) .................. 10 2007 058 052

(51) Int. Cl.
*B65G 49/07* (2006.01)

(52) U.S. Cl. ... 414/217; 118/719; 118/729; 204/298.25; 414/939

(58) Field of Classification Search ............... 204/298.25
See application file for complete search history.

(56) References Cited

U.S. PATENT DOCUMENTS

| | | | | |
|---|---|---|---|---|
| 3,973,665 | A | * | 8/1976 | Giammanco ................ 198/775 |
| 4,929,139 | A | * | 5/1990 | Vorreiter et al. ............. 414/217 |
| 5,382,126 | A | * | 1/1995 | Hartig et al. ................ 414/217 |
| 5,405,445 | A | * | 4/1995 | Kumada et al. ............. 118/719 |
| 5,658,114 | A | * | 8/1997 | Mahler ........................ 414/217 |
| 5,882,415 | A | * | 3/1999 | Helling et al. .......... 118/723 EB |
| 6,168,741 | B1 | * | 1/2001 | Foldes ........................ 264/244 |
| 7,264,741 | B2 | * | 9/2007 | Hartig ........................ 216/37 |
| 7,749,364 | B2 | * | 7/2010 | Hartig ..................... 204/298.23 |
| 7,776,192 | B2 | * | 8/2010 | Erbkamm et al. ....... 204/298.07 |
| 7,886,686 | B2 | * | 2/2011 | Fourezon et al. ............ 118/500 |
| 2006/0177288 | A1 | * | 8/2006 | Parker et al. ................. 414/217 |
| 2007/0224348 | A1 | * | 9/2007 | Dickey et al. ............. 427/248.1 |
| 2007/0274810 | A1 | * | 11/2007 | Holtkamp et al. .......... 414/217 |

FOREIGN PATENT DOCUMENTS

| | | |
|---|---|---|
| DE | 10122310 A1 | 11/2002 |
| DE | 102004021734 A1 | 12/2005 |
| DE | 102005024180 A1 | 11/2006 |
| GB | 2171119 A  * | 8/1986 ............. 414/217 |

* cited by examiner

*Primary Examiner* — James Keenan
(74) *Attorney, Agent, or Firm* — Heslin Rothenberg Farley & Mesiti P.C.

(57) ABSTRACT

In a transfer chamber having a housing with a transfer region and a passing band region, a transport device comprising a first arrangement of transport rollers is arranged in the transfer region of the housing, and a passing band comprising a second arrangement of transport rollers is arranged in the passing band region of the housing. The passing band region of the housing is subdivided by a horizontal wall, which is arranged above the passing band, into a transport space, which is located below the horizontal wall, and a pump space, which is located above the horizontal wall. The pump space has a vacuum port or a vacuum pump connected to it.

11 Claims, 1 Drawing Sheet

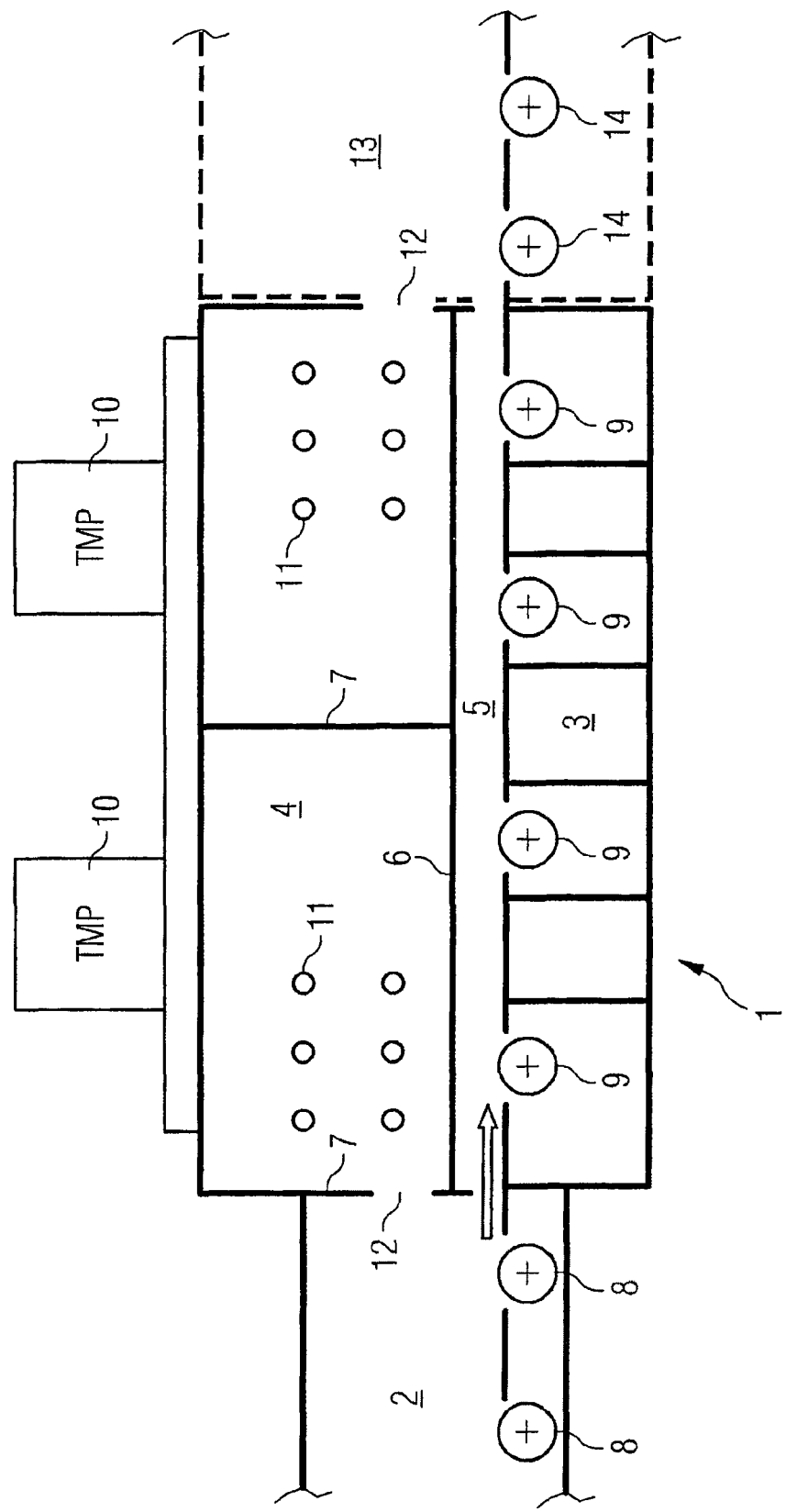

TRANSFER CHAMBER FOR A VACUUM PROCESSING APPARATUS, AND A VACUUM PROCESSING APPARATUS

CROSS REFERENCE TO RELATED APPLICATIONS

This application claims priority of German application No. 10 2007 058 052.7 filed on Nov. 30, 2007, the entire disclosure of this application is being hereby incorporated herein by reference.

BACKGROUND ART

The invention concerns a technical solution for reduction of the design length of inline coating installations, especially those for coating flat substrates, like plate glass sheets. These installations typically include on each end a lock area and several process chambers, arranged one behind the other behind the lock areas for cleaning and/or activation and/or coating of the substrates being treated, as well as optionally one or more pump chambers for evacuation of the installation and for vacuum separation between different process chambers.

Transport devices are ordinarily provided in this installation to transport substrates through the installation. In horizontal installations, the transport devices can include horizontal arrangements of roll-shaped transport rollers, at least some of which are drivable, and on which the substrates, for example, plate glass sheets, are transported through the installation horizontally.

A lock area can then include a lock chamber or a combination of lock chamber and one or more buffer chambers. So-called transfer areas are arranged between the substrate transport operating discontinuous in the lock and buffer chambers at the input and output of the installation and the continuously operating substrate transport in the process chambers before and after the process chambers. The transfer areas assume the task of transfer between discontinuous and continuous substrate transport (or vice versa).

The transfer chamber on the input side generally has narrow openings on both sides, namely, an introduction opening and an exit opening, through which the substrates can be moved into the transfer chambers and out of them. On leaving the transfer chamber, the substrate passes through the exit opening into the chamber connected to the transfer chamber, which can be a pump chamber or a process chamber, and is then treated, i.e., cleaned and/or activated and/or coated. In the transfer area, which is positioned in front of the process area, a so-called passing band is arranged on the output side. In the same manner, a passing band is arranged on the input side in a transport area positioned after the process area.

This passing band is a separately controllable transport device disconnected from the other transport system of the installation, which serves to accomplish substrate transport, so that gap-less approach of the next substrate to the preceding substrate is made possible in the process area. The driven transport rolls of the passing band serve to adjust the transport speed of the substrates from the feed speed in the front part of the transfer chamber, which typically is about 90 m/min, to the process speed in the subsequent process chambers, which, depending on the coating method, is typically about 1 to 12 m/min. On leaving the process area, the subsequently positioned passing band assumes the described function in the opposite sequence. The transport speeds of the transport devices of the transport area and the passing band can be switched in alternation between high and low speeds.

In known installations, the first functional unit of the process area after the passing band is therefore a pump section. Such an installation is depicted, for example, in FIG. 1 of Patent Application DE 10 2005 024 180 A1, in which a passing band 8 is arranged in a transfer chamber 1, which is bounded on the top by a horizontal partition (without reference number), in order to keep the volume to be evacuated low. A pump chamber 12 is connected to the transfer chamber and a coating compartment (not shown) is connected to it (cf. paragraph [0026]).

To shorten such known installations, it was proposed in DE 10 2005 024 180 A1 that the area of the passing band be combined within the transfer chamber with a pump chamber. This produces, in the transfer chamber on the input side on the end and in the transfer chamber in the output side at the beginning, an area, in which the passing band and pump section are combined. According to the solution proposed in DE 10 2005 024 180 A1, the pump chamber 12 can be dispensed with out replacement, because the vacuum pumps 9 otherwise provided there are "pulled in" to the transfer chamber. In the solution proposed there, the total length of the vacuum processing installation is reduced by omitting the separate pump chamber 12; however, by accommodating the vacuum pumps in the transfer chamber above the passing band, a significantly larger volume must now be evacuated.

The solution according to the present application proceeds in another way. Starting again from the prior art, as was already presented in FIG. 1 in DE 10 2005 024 180 A1, it is now proposed to make the separate pump chamber 12 superfluous, in that the vacuum pumps 12 are "pulled in" to the transfer chamber, as in the solution according to FIG. 2 from DE 10 2005 024 180 A1; but, this time, creation of additional volume above the passing band, which must then be evacuated, is avoided. This is achieved in that, relative to the prior art according to FIG. 1 of DE 10 2005 024 180 A1, the vacuum pumps are arranged on the upper chamber wall, the horizontal partition being retained, however, above the passing band.

BRIEF SUMMARY OF INVENTION

In a transfer chamber with a housing, having a transfer area and a passing band area, in which a transport device with a first arrangement of transport rolls is arranged in the transfer area of the housing, and in which a passing band with a second arrangement of the transport rolls is arranged in the passing band area of the housing, it is proposed that the housing in the passing band area be subdivided by a horizontal wall arranged above the passing band into a transport space beneath the wall and a pump space above the wall, and that the pump space have at least one vacuum connection and/or a vacuum pump.

The vacuum pumps now have their effect above the horizontal position and therefore act directly on the transfer area or/and the adjacent process chamber. The area beneath the horizontal position then forms the so-called transport space, which still has a limited volume and is not evacuated itself, but remains at a low pressure level, because of the evacuated transfer area or/and the connected, also evacuated process chamber.

Two advantageous effects can be achieved with the claimed solution: in the first place, the total length of the vacuum processing installation can be shortened by eliminating a separate pump chamber, and in the second place, the vacuum separation between the transfer area and process chamber can be improved by the horizontal partition.

It can also be proposed that the pump space be delimited by a vertical wall against the front area of the transfer chamber.

This vertical wall, according to one embodiment, can contain a suction opening to the transfer area of the transfer chamber. According to a practical example, the pump space can be divided by an additional vertical wall into at least two partial spaces. At least one vacuum connection or/and a vacuum pump can then be provided for each partial space in the pump space. The pump space or a partial space of the pump space can be connected through one or more suction openings to the transfer area of the transfer chamber or/and an adjacent process chamber.

In one embodiment, the proposed transfer chamber includes a housing, which has an introduction opening, an exit opening and a transport device arranged in the housing, which consists of a number of roll-like transport rolls arranged in a horizontal plane across the direction of transport, and also includes a passing band, which includes the drivable roll-like transport rolls and forms a separately driven roll-like transport roll group, and also includes a pump chamber area arranged behind the transfer chamber in the direction of transport with vacuum connections or/and vacuum pumps and a passing band in the pump chamber area.

The vacuum coating installation according to the invention requires less design space, i.e., it is shorter and more cost-effective than known vacuum coating installations. The pump compartment required for the first coating chamber is now arranged in the transfer chamber and combined spatially with the passing band, so that the length of the transfer chamber can be significantly reduced.

BRIEF DESCRIPTION OF THE DRAWING FIGURES

The invention is explained below with reference to a practical example and a corresponding drawing. The single FIG. 1 shows a practical example of the invention. The proposed transfer chamber is shown in FIG. 1.

DETAILED DESCRIPTION

The transfer chamber has a housing 1, which has a transfer area 2 and a passing band area 3. In the interior, a transport device with transport rolls 8 is situated in transfer area 2 and a passing band with transport rolls 9 in passing band area 3. A process chamber 13 is connected to the transfer chamber 1, which has its own transport device with transport rolls 14.

The housing 1 is divided in the passing band area 3 by a horizontal wall 6 arranged above the passing band 9 into a transport space 5 beneath wall 6 and a pump space 4 above wall 6. The substrate in transport space 5 is transported on the transport rolls of the passing band 9. The transport space 5 represents an extra-long gas separation tunnel between the transfer area 2 and the first process chamber 13, which is connected to the transfer chamber 1 and has an additional transport device for transport rolls 14.

The pump space has two vacuum pumps 10. The pump space is divided between the two vacuum pumps 10 by a vertical wall 7. The right part of the pump space 4 in the FIGURE is connected via a suction opening 12 of housing 1 to the adjacent process chamber 13, so that the vacuum pump 10 of the transfer chamber, shown on the right side of the FIGURE, can be used to evacuate the process chamber 13. The pump space 4 is also delimited by an additional vertical wall 7 with an additional suction opening 12 relative to the transfer area 2, so that the vacuum pump 10 depicted on the left in the FIGURE can be used to evacuate the transfer area 2.

Both partial areas of pump space 4 are each equipped with a cooling trap 11, in order to trap condensable components of the process atmosphere.

The invention claimed is:

1. Transfer chamber of a vacuum processing installation for treating substrates, the transfer chamber being located in front of an entrance to an initial treatment chamber or behind an exit of a final treatment chamber of the installation, the transfer chamber comprising a housing with a transfer area and a passing band area, a transport device operating at a feed speed arranged in the transfer area of the housing, the transport device including a first arrangement of transport rollers, a passing band arranged in the passing band area of the housing, the passing band including a second arrangement of transport rollers, separately driven from the first arrangement of transport rollers and serving to adjust a transport speed of the substrates in the passing band area between the feed speed and a different process speed in the initial treatment chamber or the final treatment chamber, and wherein the housing, throughout the passing band area, includes a horizontal wall arranged above the passing band, the horizontal wall dividing and fully separating the passing band area into a substrate transport space beneath the wall and a separate evacuated pump space above the wall, and the pump space has at least one vacuum connection and/or a vacuum pump evacuating the separate evacuated pump space without directly evacuating the substrate transport space.

2. Transfer chamber according to claim 1, wherein the pump space is delimited by a vertical wall relative to the transfer area of the transfer chamber.

3. Transfer chamber according to claim 2, wherein the vertical wall, through which the pump space is delimited relative to transfer area, contains a suction opening to the transfer area.

4. Transfer chamber according to claim 1, wherein the pump space is divided by a vertical wall into at least two partial spaces and each partial space has at least one vacuum connection or/and a vacuum pump.

5. Transfer chamber according to claim 1, wherein the pump space is adapted to be connected via at least one suction opening to the initial treatment chamber or the final treatment chamber.

6. Transfer chamber according to claim 1, wherein the pump space has at least one cooling trap.

7. Transfer chamber according to claim 1, wherein the second arrangement of transport rollers serves to provide gapless approach of a next substrate to a preceding substrate in the initial treatment chamber.

8. Transfer chamber according to claim 1, wherein the passing band area is devoid of any substrate treating device.

9. Transfer chamber according to claim 1, wherein the transport device comprises a discontinuous transport device and the process speed in the initial treatment chamber or the final treatment chamber is provided by a continuous transport device.

10. Transfer chamber according to claim 1, wherein the substrate transport space provides a gas separation tunnel between the transfer area and the initial treatment chamber or the final treatment chamber.

11. Vacuum coating installation, comprising the transfer chamber according to claim 1, wherein the initial treatment chamber or the final treatment chamber comprises a vacuum coating chamber for coating the substrates.

* * * * *